United States Patent [19]

Okada et al.

[11] Patent Number: 4,661,301
[45] Date of Patent: Apr. 28, 1987

[54] METHOD FOR PRODUCING LAMINATE BOARD CONTAINING UNIFORMLY DISTRIBUTED FILLER PARTICLES

[75] Inventors: Reisuke Okada; Hisami Fujino, both of Otsu, Japan

[73] Assignee: Toray Industries, Inc., Tokyo, Japan

[21] Appl. No.: 765,476

[22] Filed: Aug. 14, 1985

[51] Int. Cl.$^4$ .............................................. B29C 47/34
[52] U.S. Cl. ................................... 264/41; 29/830;
29/848; 156/228; 156/242; 156/306.9;
156/307.7; 264/46.1; 264/46.2; 264/104;
264/108; 264/137; 264/216; 264/258;
264/DIG. 6
[58] Field of Search ............... 264/137, 136, 113, 258,
264/41, DIG. 6, 212–216, 109, 108, 210.2, 104,
46.1, 46.2, 347; 425/327, 224, 371; 29/830, 848;
156/228, 242, 306.9, 307.7

[56] References Cited

U.S. PATENT DOCUMENTS

| | | | |
|---|---|---|---|
| 2,854,372 | 9/1958 | Yan et al. | 264/109 |
| 2,993,235 | 7/1961 | Brown et al. | 264/108 |
| 3,103,406 | 9/1963 | Milewski et al. | 264/41 |
| 3,257,484 | 6/1966 | Barnette | 425/224 |
| 3,434,861 | 3/1969 | Luc | 264/213 |
| 3,586,573 | 6/1971 | Vissers | 425/371 |
| 3,832,426 | 8/1974 | Malthouse | 264/41 |
| 4,518,737 | 5/1985 | Traut | 264/122 |

OTHER PUBLICATIONS

IBM Tech. Disclosure Bull (USA) vol. 22, No. 5, 1799, Oct. 1979.

Primary Examiner—Jeffery Thurlow
Attorney, Agent, or Firm—Armstrong, Nikaido, Marmelstein & Kubovcik

[57] ABSTRACT

A process for continuously molding a plate for an electrical printed circuit board wherein a resin containing uniformly distributed hollow microspheres having a specific gravity different from that of the resin is extruded into a vertically disposed moving double belt press maintained at a temperature which allows the extruded plate to harden almost completely. The plate exists the vertically disposed press maintaining a flexibility sufficient to be passed around a roller into a horizonal position where subsequent processing steps may be applied, such as lamination of reinforcing fiber and coating with a conductive material.

8 Claims, 4 Drawing Figures

METHOD FOR PRODUCING LAMINATE BOARD CONTAINING UNIFORMLY DISTRIBUTED FILLER PARTICLES

BACKGROUND OF THE INVENTION

1. Field of the Invention

The present invention concerns a laminate board which is applicable to the manufacture of a printed circuit board and a process for continuous molding of a plate for use in producing the laminate board.

2. Description of the Prior Art

It is well-known that a material having a low dielectric constant (Er) and dissipation factor (tan δ) is advantageous for use in printed circuit boards. As the dielectric constant goes down, the electric performance, as measured by time delay, capacitance, and other factors, is improved.

Many materials having a low dielectric constant, such as polyethylene, poly 4-methyl pentene-1, polystyrene, polytetrafluoroethylene are not necessarily suitable for use in printed circuit boards from the viewpoints of heat resistance, cost or processability.

Incorporation of a filler into a resin is a well-known technique for improving properties of the resin such as electric, optical, mechanical, electromagnetic, frictional, chemical and other properties.

One method for lowering the dielectric constant of a material is to incorporate a filler such as one consisting of hollow microspheres, as disclosed in Japanese Patent Publication No. 18353/82 (Tokko-sho No. 57-18353); and F. W. Haining & D. G. Herbaugh, IBM TECH. DISCLOSURE BULL (USA) Vol. 22. No. 5, 1799, October 1979. The glass epoxy laminates prepared by conventional processes according to the above method using epoxy/microsphere prepregs, however, do not necessarily perform well in a printed circuit board. For example, the board's deviation from flatness, such as bending and twisting causes problems in subsequent treatments such as soldering, etching, drilling, laminating of resist, and plating. These defects may be due to uneven distribution of the filler in the prepregs. Furthermore, the electrical insulation of the board is not as large as is required when the board is immersed in boiling water. Voids formed between the filler and the reinforcing fabric are considered responsible for these disadvantages.

SUMMARY OF THE INVENTION

An object of the present invention is to provide a novel laminate board which satisfies the requirements of electrical insulation and low dielectric constant. Another object is to provide a new process for producing a plate applicable to the production of a laminate with none of the disadvantages described above. More specifically, the invention provides a laminate board comprising a center plate which comprises a resin and filler particles uniformly distributed in said resin and sheets provided on both sides of the center plate which comprise resin and reinforcing fabric. When the board is used in a printed circuit board, copper foils are further laminated to it.

The plate of this invention is prepared by continuous molding of a mixture comprising a resin and a filler, wherein the mixture of resin and filler is at least partly solidified while moving through a vertically disposed pass.

DESCRIPTION OF THE PREFERRED EMBODIMENTS

Figure 1:
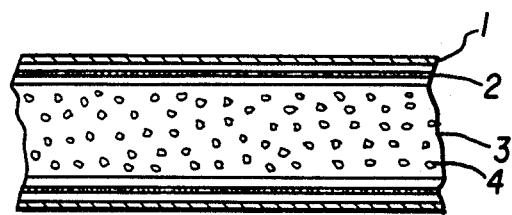
FIG. 1 shows a cross-section of an embodiment of the laminate board according to the present invention.

A typical example of a copper foil-clad laminate board of this invention is shown in FIG. 1. A center plate is sandwiched between impregnated reinforcing fabrics 2 which are covered by copper foils 1. The center plate comprises a resin 3 wherein particles of a filler 4 are distributed uniformly.

It is well-known to prepare a continuous plate of a comparatively large thickness by extruding a monomer or polymer from a slit or die, allowing the extruded material to flow on a horizontally moving belt and hardening it by heating or cooling during its passage on the belt.

Figure 2:
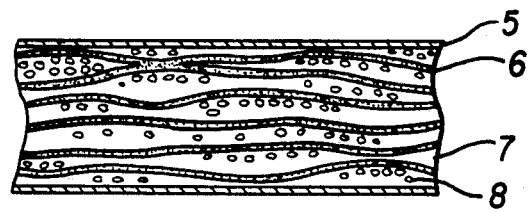
FIG. 2 shows a comparative cross-section of a laminate board disclosed in the prior art (Japanese Patent Publication No. 18353/82).

Such method is satisfactory for the preparation of a plate from homogeneous resin liquid such as molten resin or a solution of a resin. However, in the case of a heterogeneous solution like polymer/filler mixture the known extrusion method is not satisfactory. In order to prepare a uniform mixture, it is necessary to use a resin having as low a viscosity as possible. However, the low viscosity of the mixture (less than $10^3$ poises) together with the specific gravity difference (of more than 0.2) between the resin and the filler give rise to serious dislocation of the filler during continuous molding of the plate. Consequently, as shown in FIG. 2, asymmetric distribution of the filler 8 in the resin 7 occurs in the direction perpendicular to the surface of the plate (hereafter designated as Z-direction) in each layer between neighboring glass cloths 6. The use of this plate in a printed circuit board clad with copper foils 5 imparts undesirable properties to the board, in particular, bending of the board. This bending is often aggravated by subsequent treatments such as soldering and etching.

To prevent asymmetric filler distribution in a plate extruded by the prior art method, it is necessary to reduce the thickness of the layer of resin/filler mixture in order to bring the filler in close contact with the reinforcing fabric 2 and thereby prevent movement of the filler in the resin. This means that the adjacent reinforcing fabrics must be brought into contact with each other and, accordingly, only a small amount of filler can be used. Furthermore, because in practice the particle size distribution of the filler is very large, it is not possible to prevent movement of the smaller filler particles.

Figure 3:
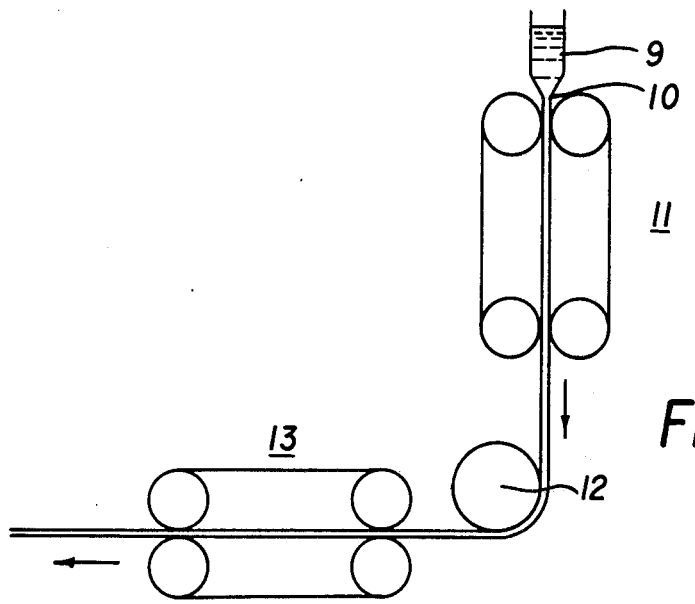
FIG. 3 shows a schematic diagram of the process of this invention.
Figure 4:
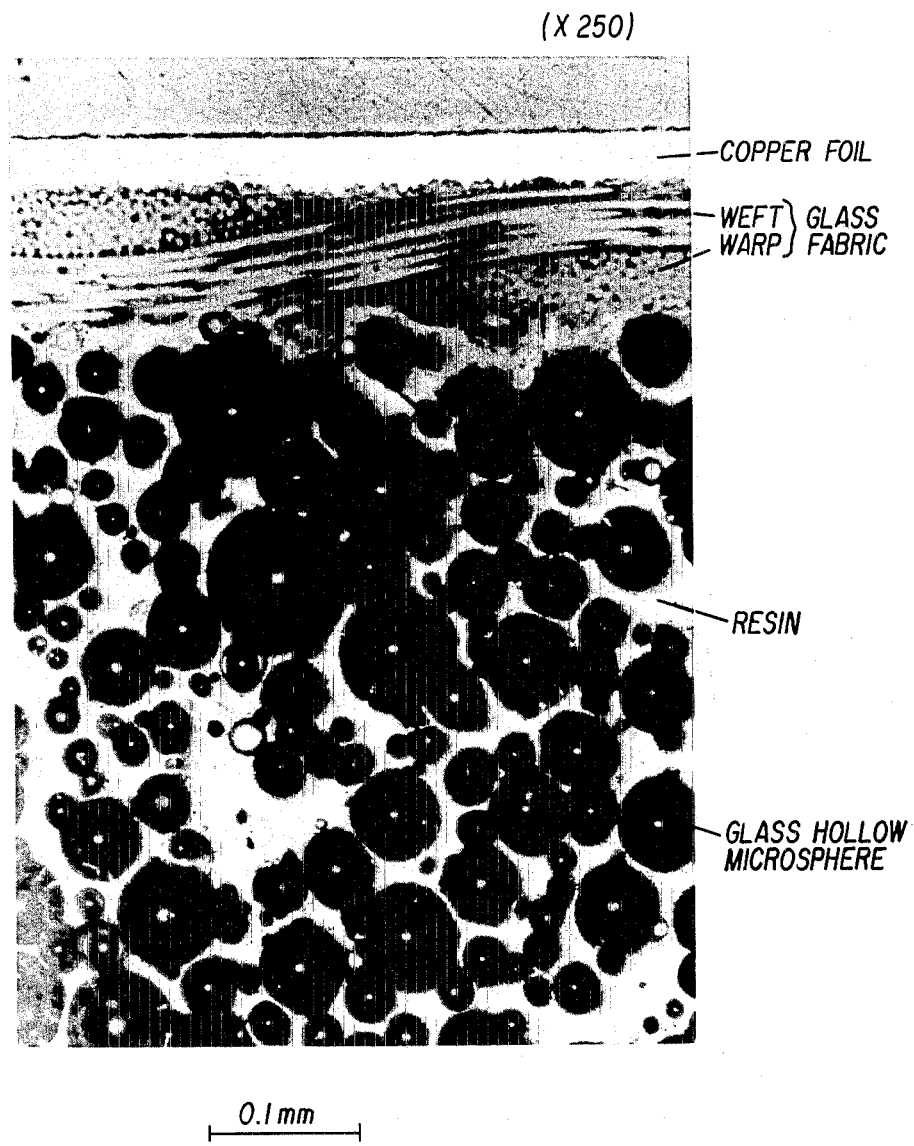
FIG. 4 shows a microphotograph of a cross-section of a laminate board of this invention.

FIG. 3 shows a schematic diagram of the process of this invention. A mixture 9 of a resin and a filler is extruded from a slit 10 to flow onto vertical double belt press 11. By this arrangement, the filler does not move in the horizontal direction (Z-direction) even when the difference in specific gravity between the resin and the filler is large. The mixture is hardened by heating or cooling while it is passing between the pair of belts. The plate, which is partially hardened but retains some plasticity, is conveyed by roll 12 which changes the direction of the movement of the plate from vertical to horizontal. In order to prevent the plate from breaking upon being bent around the roll, the size of the roll is selected according to the hardness of the plate. Thus, the harder the plate, the larger the roll. Upon leaving the roll 12, the plate is conveyed on a horizontal double belt press 13. At this point, the filler neither sinks nor floats to cause asymmetric distribution, since the resin has hardened sufficiently to prevent movement of the filler particles.

In the present invention, thermosetting resins such as phenol, epoxy, furan, unsaturated polyester, xylene, alkyd, sulfonic amide, melamine resins, and thermoplastic resins such as polyamide, polyester, polyolefin, polystyrene, polyphenylene oxide, polyphenylene sulfide, polysulfone, polyethersulfone, polyetherimide, polyacetal, polycarbonate, polyvinylidene fluoride and polyacrylate resins may be used. The resin of the center plate is not necessarily the same as that of the sheets to be laminated on the center plate.

The filler material is selected according to the required properties of the board. For example, for the purpose of lowering the dielectric constant, it is advantageous to use hollow microspheres of alumina, silica, zirconia, glass, carbon and phenol resin. The preferred filler in this case consists of hollow glass microspheres of 20–150 μm in diameter having a glass thickness 0.5–2 micro meters. The volume fraction of filler based on the total volume of the center plate should be 0.3 to 0.8, more preferably 0.5 to 0.7.

As the reinforcing fabric, woven and non-woven sheets made of inorganic or organic fibers, preferably glass fiber, quartz fiber, polyaramid fiber "Kevlar" may be used.

This invention is particularly useful in situations where the difference in specific gravity between the resin and the filler is large, especially more than 0.5, where the viscosity of the resin to be mixed is low, especially less than $10^2$ poises, and further, where the size of the filler particles is relatively large (more than 5 microns). For example, in practical applications, there are many cases where a resin must be used which has a viscosity of less than 10 poise.

EXAMPLE 1

Epoxy resin composition was prepared with 100 parts of diglycidyl ether of Bisphenol A ("EPIKOTE" 828: YUKA SHELL CO.), 86 parts of methyl hexahydrophthalic anhydride ("EPICLON" B650: DAINIHON INK CO.) and 1 part of dimethylbenzylamine Parts refer to parts by weight). This epoxy resin composition has a viscosity of 5 poises at 25° C.

Glass microsphere ("GLASS BUBBLES" B38/4000: 3M INC.) of 50 micro meters in average diameter and specific gravity 0.38 was used as a filler.

A mixture was obtained by mixing the epoxy resin composition and the glass microspheres in a volume ratio of 40/60 at room temperature. The mixture was allowed to defoam in vacuum. Then it was extruded from a slit onto a vertically disposed moving double belt press of 2 meter long, as shown in FIG. 3. The speed of the pair of moving belts was 8 meters/hour. The temperature of the belt was kept at 150° C. After passing through the vertically disposed belt, the almost fully hardened plate was moved along a roll of 900 mm diameter to change its direction from vertical to horizontal. Then, the plate was moved horizontally by a second double belt press of 2 meter long kept at a temperature of 170° C. As a result, a plate of 15 mm in thickness and of specific gravity 0.80 was obtained.

Glass cloth (WE116E: NITTO BOSEKI CO.) of 150 μm thickness was impregnated with the above epoxy resin composition to obtain a sheet (prepreg).

A laminate board was prepared by sandwiching the plate between two sheets of prepreg and then between two sheets of copper foil as in FIG. 1 by use of a conventional heating press.

The properties of the board are shown in Table 1 from which it is seen that a laminate board of good performance was obtained.

TABLE 1

|  | Properties of board | | |
| --- | --- | --- | --- |
|  | Example 1 | Comp. Ex. 1 | Comp. Ex. 2 |
| Thickness (mm) | 1.60 | 1.63 | 1.60 |
| Er (1 MHz) | 2.5 | 2.6 | 2.7 |
| tan δ (1 MHz) | 0.010 | 0.015 | 0.020 |
| Insulation Resistance (Ω) | $5.6 \times 10^9$ | $1.5 \times 10^7$ | $3.5 \times 10^9$ |
| Bending (%) | 0.0 | 0.7 | 1.5 |

Index of bending was evaluated according to the standard test method. (IPC-TM-650).

COMPARATIVE EXAMPLE 1

Using the same materials (epoxy resin composition, hollow microsphere and glass cloth) as in Example 1, a prepreg was produced by ordinary impregnation according to a prior art method (Tokko sho No. 57-18353). A board was obtained by laminating six sheets of the prepreg and two sheets of copper foil by use of heating press. FIG. 2 shows the schematic diagram of the board obtained. Table 1 shows the properties of this board as compared with the board of Example 1. It can be seen that the electrical insulation resistance of this board is small and its bending is a little larger than observed in the board of Example 1.

COMPARATIVE EXAMPLE 2

Using the same materials as in Example 1, the epoxy resin composition and glass hollow microspheres were mixed. The mixture was extruded from a slit onto a horizontal double belt press. The speed of the moving belt was 8 meters/hr and its temperature was kept at 150° C.

A copper-clad laminate board was obtained in the same manner as in Example 1. The properties of this board are shown in the third column of Table 1. It can be seen that the bending of this board is considerably larger than was observed in Example 1.

We claim:

1. A process for continuous molding of a plate for an electrical printed circuit board comprising a resin and hollow microspheres uniformly distributed in said resin, wherein the hollow microspheres have a specific gravity different from that of the resin, comprising the step of:
   extruding a mixture of a resin and hollow microspheres into a vertically disposed moving double belt press maintained at a temperature which allows the extruded plate to harden almost completely.

2. The process of claim 1, wherein subsequent take up of the plate is performed substantially in the horizontal direction.

3. The process of claim 1, wherein the difference in specific gravity between the filler and the resin is more than 0.2.

4. The Process of claim 1, wherein the difference in specific gravity between the filler and the resin is more than 0.5.

5. The Process of claim 1, wherein the viscosity of the resin at 25° C. is less than $10^3$ poises.

6. The Process of claim 1, wherein the viscosity of the resin at 25° C. is less than $10^2$ poises.

7. The Process of claim 1, wherein the average size of the filler particle is more than 5 microns.

8. The process of claim 1, further comprising the steps of laminating preimpregnated reinforcing fibers to said plate on opposite sides thereof and laminating at least one sheet of copper foil to said preimpregnated reinforcing fiber layer.

* * * * *